(12) United States Patent
Addington et al.

(10) Patent No.: US 7,728,425 B2
(45) Date of Patent: Jun. 1, 2010

(54) SEAL OF FLUID PORT

(75) Inventors: Cary G. Addington, Albany, OR (US); Shell Elaine Whittington, Corvallis, OR (US); Peter Mardilovich, Corvallis, OR (US); William Wren, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 563 days.

(21) Appl. No.: 11/157,350

(22) Filed: Jun. 21, 2005

(65) Prior Publication Data

US 2007/0000600 A1  Jan. 4, 2007

(51) Int. Cl.
*H01L 23/10* (2006.01)
(52) U.S. Cl. .............. 257/710; 257/678; 257/704; 257/682; 257/E23.127; 257/E23.18; 257/E23.181; 257/E23.193; 257/E23.096
(58) Field of Classification Search .............. None
See application file for complete search history.

(56) References Cited

U.S. PATENT DOCUMENTS

| 4,400,870 A | 8/1983 | Islam |
| 4,521,668 A | 6/1985 | Osial et al. |
| 4,685,200 A | 8/1987 | Bokil |
| 4,914,269 A | 4/1990 | Kinsman |
| 4,961,106 A * | 10/1990 | Butt et al. .................. 257/710 |
| 5,133,795 A | 7/1992 | Glascock, II |
| 5,135,890 A * | 8/1992 | Temple et al. .............. 438/123 |
| 5,477,008 A * | 12/1995 | Pasqualoni et al. ......... 174/539 |
| 5,578,869 A * | 11/1996 | Hoffman et al. ............ 257/691 |
| 5,585,671 A * | 12/1996 | Nagesh et al. .............. 257/697 |
| 6,195,142 B1 * | 2/2001 | Gyotoku et al. ............. 349/69 |
| 6,384,473 B1 * | 5/2002 | Peterson et al. ............ 257/680 |
| 2003/0141002 A1 * | 7/2003 | Flanagan ..................... 156/64 |
| 2004/0212051 A1 * | 10/2004 | Zhao et al. .................. 257/672 |
| 2005/0095835 A1 * | 5/2005 | Humpston et al. .......... 438/613 |
| 2006/0049396 A1 * | 3/2006 | Pichler et al. ................. 257/40 |

FOREIGN PATENT DOCUMENTS

JP            403272592 A    * 12/1991

* cited by examiner

*Primary Examiner*—Minh-Loan T Tran
*Assistant Examiner*—Fei Fei Yeung Lopez

(57) ABSTRACT

One embodiment of an electronic component packaging system includes a base adapted for supporting an electronic component, a lid sealed to the base, the lid including a fillport, and the fillport hermetically sealed by light irradiation.

24 Claims, 1 Drawing Sheet

SEAL OF FLUID PORT

BACKGROUND

Electronic components, such as micro electromechanical systems (MEMS), may be encapsulated within a package to protect the electronic component from environmental hazards such as humidity, electrical interference, dust, physical contact, and the like. Providing a hermetically sealed atmosphere for the electronic component within the package may reduce the effect of environmental hazards.

After initial sealing of the package, which may include hermetically sealing a cover to a base, fluid may be added to the interior of the package through a fluid port in the cover. The fluid port may then be sealed. Some sealing materials used to seal the fluid port may degrade the life or operation of the component or the fluid, or may result in a non-hermetic seal. Other methods of sealing the fluid port may require the package to undergo heating to a temperature that may damage the electronic component or the fluid, or may create a mismatch between the coefficient of thermal expansion of the fluid port seal and the cover. This may stress the electronic component or may result in a failure of the seal between the fluid port seal and the cover. Still other sealing methods may require welding or high compression forces that are not suited for certain types of cover materials such as glass or ceramics.

DETAILED DESCRIPTION OF THE DRAWINGS

Figure 1:
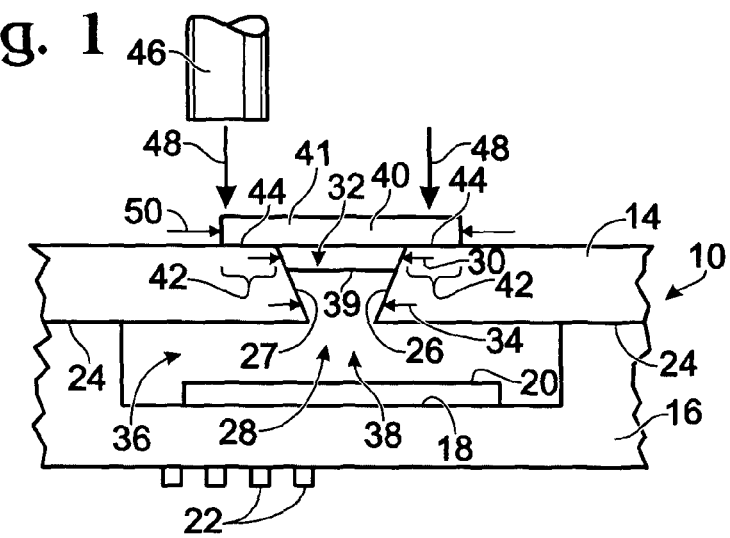
FIG. 1 is a schematic cross-sectional side view of one embodiment of a method of sealing one embodiment of a package.

FIG. 1 is a schematic cross-sectional side view of one embodiment of a method of sealing one embodiment of a container 10, also referred to as a package. Container 10 may include a cover 14 and a base 16 that may include a support surface 18 for receiving an electronic component, such as a microelectronic component 20. Microelectronic component 20 in the exemplary embodiment may comprise a micro electromechanical system (MEMS) chip but in other embodiments may comprise any type of microelectronic structure. Container 10 may further include connection pins 22 (only a few pins are shown for ease of illustration) on an exterior thereof for accessing microelectronic component 20 when the microelectronic component is sealed within container 10. Cover 14 and base 16 of container 10 may be manufactured of metal, a metal alloy, ceramic, plastic, silicon, glass, or any other suitable material. Cover 14 may be secured to base 16 by any suitable method to define a hermetic seal 24 therebetween.

Cover 14 may include a fluid port 26, such as a tapered aperture 27, that may narrow in a lower region 28 of the tapered aperture. Tapered aperture 27 may define a first width 30 in an upper region 32 thereof and a second width 34 in lower region 28 thereof. In one embodiment, aperture 27 may define a conical tapered aperture that may be created by a laser, wherein first width 30 may be a diameter in a range of approximately 100 um to 2 mm and second width 34 may be a diameter in a range of approximately 50 um to 1.8 mm. In other embodiments, other shapes and sizes of fluid port 26 may be positioned in cover 14, such as a non-tapered cylindrical aperture, a square aperture, an oval slot, a cluster of small cylindrical apertures, or the like.

After initial sealing of cover 14 to base 16, fluid port 26 may be utilized to fill an interior 36 of container 10 with a fluid 38, such as water, ink, dielectric fluid, an inert fluid, fuel, alcohol, or a mixture thereof, for example, to a fluid level 39. Fluid 38 may enhance the operation of microelectronic component 20 or may protect component 20 from environmental conditions. After fluid 38 is positioned within interior 36 of container 10, fluid port 26 may be sealed by laser irradiation.

Still referring to FIG. 1, in one embodiment, fluid port 26 may be sealed by a sealing structure 40, such as a plate 41, positioned over fluid port 26 and secured to cover 14 by laser irradiation around an edge region 42 of plate 41. This may be accomplished, for example, by an edge fillet weld or a face weld through the cover. In the embodiment of a face weld, it may be necessary to use a cover that is partially transparent to the wavelength of the focused light irradiation being used so that the energy of the focused light may pass through the cover and create a weld to the surface beneath. In the embodiment shown plate 41 may be manufactured of an inert material, such as silicon, glass, ceramic, metal based materials, and the like, that may define a coefficient of thermal expansion (CTE). Cover 14 may also be manufactured of an inert material, such as silicon, glass, ceramic, metal based materials, and the like, and may be the same material as plate 41. Use of inert materials may reduce or eliminate contamination of the electronic component or the fluid contained within container 10. Inert and impermeable materials may also provide a hermetic and long-lived seal. The material of cover 14 may define a CTE that is substantially the same as the CTE of plate 41. Substantially the same may be defined as a CTE of cover 14 that is within a ten percent difference in value from the CTE of the sealing structure 40, such as plate 41. Common Coefficient of Thermal Expansion values are given in Table 1 below.

TABLE 1

CTEs for some common electronic materials

| material | CTE (ppm/° C.) |
|---|---|
| silicon | 3.2 |
| alumina | 6–7 |
| copper | 16.7 |
| tin-lead solder | 27 |
| E-glass | 54 |
| S-glass | 16 |
| epoxy resins | 15–100 |
| silicone resins | 30–300 |

The CTE values recited in Table 1 above may be an average over a wide temperature range. However, CTE values may not be defined by a linear function with temperature, and may not define a smooth function if the material undergoes a phase transition. Accordingly, the particular CTE values recited in Table 1 are given for illustrative purposes but such CTE values may vary widely depending on conditions of a particular application.

Accordingly, as the edge region 42 of plate 41 and the corresponding region of cover 14 that lies under edge region 42 of plate 41, are heated, the CTE of the plate and the cover may not result in a CTE mismatch, such that a hermetic seal 44 may be defined between cover 14 the sealing structure 40, such as plate 41. Moreover, directing a laser 46 around only an edge region 42 of plate 41 may result in only localized heating of edge region 42 such that a remainder of cover 14, fluid 38, base 16 and microelectronic component 20 are not substantially heated. Accordingly, laser irradiation may result in a hermetic seal of fluid port 26 without damaging other components of container 10. In other embodiments, plate 41 and cover 14 may each be manufactured of a metal, a metal alloy, ceramic, plastic, silicon, or any other suitable material.

To seal plate 41 to cover 14, any type of thermal effect focused light may be utilized, such as a focused intensive light, namely a laser 46. In one embodiment, a laser having a beam in the infrared region may be utilized to achieve the thermal effect desired. In particular, laser 46 may comprise a carbon dioxide laser that produces a laser beam 48 having a wavelength in the mid-infrared range, and more particularly, a wavelength in a range of 9.0 to 11.0 microns. In another embodiment, the laser may have a wavelength in the near-infrared range, such as a Neodymium:Yttrium Aluminum Garnet (Nd:YAG) laser with a wavelength of approximately 1064 nm, or a semiconductor laser having a wavelength in a range of 800 to 950 nm. Such a wavelength may improve face welding the plate if the plate is manufactured of a silicon or glass material, such as Corning (Registered Trademark) 1737 glass. In the embodiment wherein fluid port 26 defines a conical tapered aperture 27 having width 30 across upper region 32 of the aperture, plate 41 may define a circular plate having a width 50 slightly greater than width 30. Accordingly, in this embodiment, edge region 42 may define a ring positioned around upper region 30 of tapered aperture 27 and around the outer edge of plate 41. In one embodiment, width 30 of upper region 32 of tapered aperture 27 may be in a range of approximately 100 microns to 2 mm and width 50 of plate 41 may be approximately 200 microns or more. Accordingly, edge regions 42 on either side of tapered aperture 27 may have a width of approximately 50 microns. Laser 46 may be directed only over edge region 42, which may be referred to as a sealing region, such that edge region 42 of the plate is melted and hermetically sealed to cover 14 around aperture 27. In this manner, the entire container 10 is not heated and damage to electronic component 20, and/or hermetic seal 24 between cover 14 and base 16, may be reduced or eliminated. Laser 46 may be directed only over edge region 42 by movement of the laser, movement of the container, movement of both the laser and the container, by programming the laser to movably direct its beam throughout edge region 42, or by any other suitable method. In another embodiment, a mask may be used to cover plate 41, except for edge region 42, such that the covered regions of the plate, and device 20 therebelow, may not be heated by laser 46.

Figure 2:
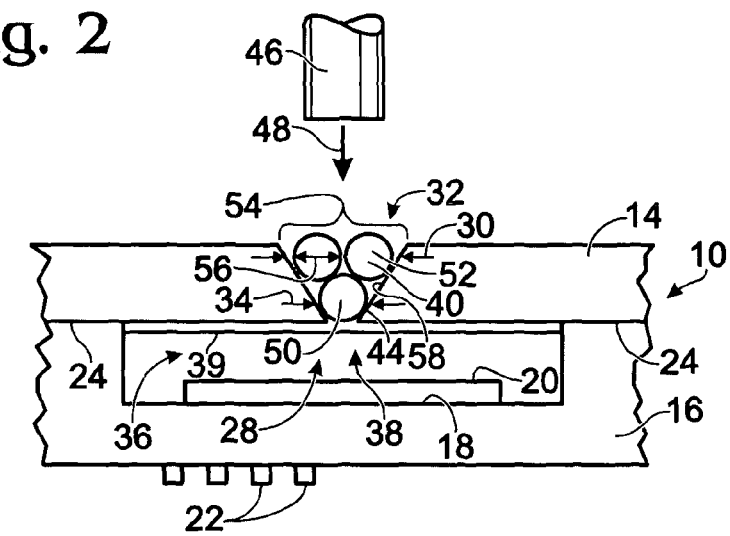
FIG. 2 is a schematic cross-sectional side view of another embodiment of a method of sealing one embodiment of a package.

FIG. 2 is a schematic cross-sectional side view of another embodiment of a method of sealing one embodiment of container 10. Sealing structure 40 may include at least one discrete sealing structure, such as at least one sphere 52. In the embodiment shown, sealing structure 40 may include a plurality of spheres 52, wherein each of spheres 52 may define a diameter 56 greater than a width 34 of lower region 28 of fluid port 26. Accordingly, spheres 52 may not fall through lower region 28 of aperture 27 of fluid port 26 into interior 36 of container 10.

To seal fluid port 26, spheres 52 are positioned in fluid port 26. The spheres are then laser irradiated with laser 46 over a sealing region 54, that may extend throughout upper region 32 of tapered aperture 27, to melt the spheres to one another and to the interior surface of tapered aperture 27. In this embodiment, fluid level 39 of fluid 38 may be positioned below tapered aperture 27 or may be positioned within tapered aperture 27 such that fluid 38 may contact spheres 52 positioned in lower region 28 of tapered aperture 27.

In the embodiment shown spheres 52 may be manufactured of an inert material, such as a glass or a ceramic material that may define a CTE. The sphere or spheres 52 may also be metallic, such as aluminum, lead, copper, or other soft metals. It may be desirable to control the environment of the focused light irradiation with an inert shield glass to protect the metal sphere or spheres from oxidation. Additionally, the shelf glass may be pre-heated to reduce stress on cover 14 during irradiation. The metal sphere or spheres may be heated until they melt to provide the hermetic seal 24, or they may simply be heated to a point that the cover seals to the sphere, without completely melting the sphere.

Cover 14 may also be manufactured of an inert material, such as a silicon based material, namely, glass or ceramic, and may be the same material as spheres 52. The material of cover 14 may define a CTE that is substantially the same as the CTE of spheres 52. Accordingly, as sealing region 54 of spheres 52 is heated, the CTE of spheres 52 and cover 14 may not result in a CTE mismatch, such that a hermetic seal 44 may be defined between the spheres themselves 52 and between the spheres 52 and an inner surface 58 of cover 14. Moreover, directing laser 46 throughout only a sealing region 54 of container 10 may result in only localized heating of sealing region 54 such that a remainder of cover 14, fluid 38, base 16 and microelectronic component 20 are not substantially heated. Accordingly, laser irradiation may result in a hermetic seal of fluid port 26 without damaging other components of container 10. In other embodiments, spheres 52 and cover 14 may each be manufactured of a metal, a metal alloy, ceramic, plastic, silicon, or any other suitable material.

To seal spheres 52 to cover 14, laser 46 may be utilized. In one embodiment, laser 46 may comprise a carbon dioxide laser that produces a laser beam 48 having a wavelength in the mid-infrared range, and more particularly, a wavelength in a range of 9.0 to 11.0 microns. In the embodiment wherein fluid port 26 defines a conical tapered aperture 27 having width 34 across lower region 28 of the aperture, each of spheres 52 may define a diameter 56 slightly greater than width 34. In one embodiment width 34 of aperture 27 may be approximately 50 microns and diameter 56 of spheres 52 may be approximately 75 microns. Laser 46 may be directed only over sealing region 54 within aperture 27 such that spheres 52 are melted and hermetically sealed to one another and to inner surface 58 of aperture 27. In this manner, the entire container 10 is not heated and damage to electronic component 20, and/or hermetic seal 24 between cover 14 and base 16, may be reduced or eliminated. Laser 46 may be directed only over sealing region 54 by movement of the laser, movement of the container, movement of both the laser and the container, by programming the laser to movably direct its beam throughout sealing region 54, or by any other suitable method.

Figure 3:
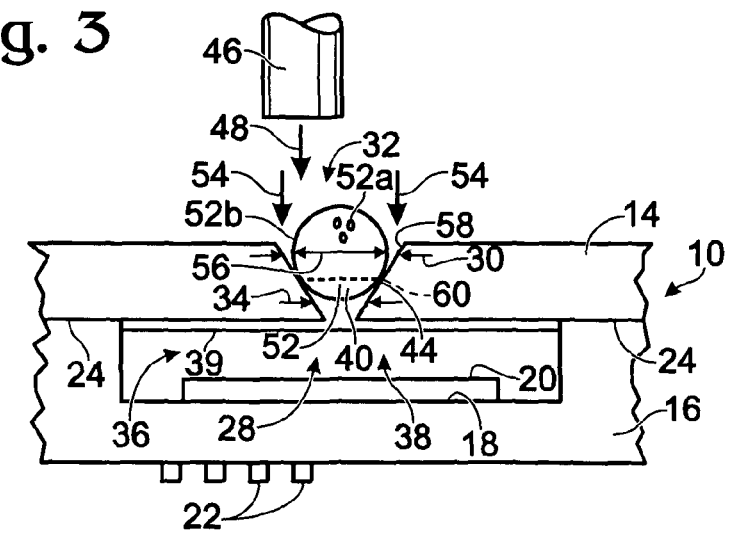
FIG. 3 is a schematic cross-sectional side view of another embodiment of a method of sealing one embodiment of a package.

FIG. 3 is a schematic cross-sectional side view of another embodiment of a method of sealing one embodiment of container 10. In this embodiment, sealing structure 40 may include one discrete sealing element, such as one sphere 52. In other embodiments, sealing structure 40 may include a tapered wedge that may substantially match a tapered wedge shape of aperture 27, a tapered plug that may substantially match a circular, tapered shape of aperture 27, or any other size or shape of sealing structure 40. In the embodiment shown, sphere 52 may define a diameter 56 greater than a width 34 of lower region 28 of fluid port 26. Accordingly, sphere 52 may not fall through lower region 28 of tapered aperture 27 into interior 36 of container 10 but instead may define a circular line of contact 60 (shown in end view in FIG.

3) that may extend around aperture 27. To seal fluid port 26, sphere 52 is positioned in fluid port 26. The sphere is then laser irradiated with laser 46 along sealing region 54, defined in this embodiment by line of contact 60, to melt sphere 52 to aperture 27 along the line of contact 60. The sphere may also be irradiated to a point that the sphere causes inner surface 58 of tapered aperture 27 to melt and seals to the sphere. This irradiation process may be suited for embodiments utilizing a metallic sphere.

Use of a single sphere 52 to seal the container may provide advantages over the multiple-sphere sealing embodiment in that in the case of a single sphere, the entire sphere need not be melted. Moreover, it may be easier to correctly position a single sphere within tapered aperture 27 than multiple spheres.

In the embodiment shown, sphere 52 may be manufactured of an inert material, such as glass or ceramic, that may define a CTE. Cover 14 may also be manufactured of an inert material, such as glass or ceramic, and may be the same material as sphere 52. The material of cover 14 may define a CTE that is substantially the same as the CTE of sphere 52. Accordingly, as line of contact 60 of sphere 52 is heated, the CTE of sphere 52 and cover 14 may not result in a CTE mismatch, such that a hermetic seal 44 may be defined between sphere 52 and cover 14. Moreover, directing laser 46 throughout only a sealing region 54, which may also be referred to as an unmasked region, of container 10 may result in only localized heating of sealing region 54 such that a remainder of cover 14, fluid 38, base 16 and microelectronic component 20 are not substantially heated. Accordingly, laser irradiation may result in a hermetic seal of fluid port 26 without damaging other components of container 10. In other embodiments, sphere 52 and cover 14 may each be manufactured of a metal, a metal alloy, ceramic, plastic, silicon, or any other suitable material. In yet another embodiment, sphere 52 may include, or may be manufactured of, one or more additives 52a that may increase the response of the sphere to focused light irradiation. In particular, sphere 52 may be manufactured of a material, such as black glass, that may have a high absorbance in a specific range of frequency that corresponds to the focused intensive light utilized to melt or partially melt the sphere. In still another embodiment, sphere 52 may be manufactured of, or may include a coating 52b of, a material having a lower melting point than high temperature glass or ceramic, and may be low temperature glass, liquid glass, or an adhesive such as glue, that is easily melted when subjected to focused intensive light irradiation.

To seal sphere 52 to cover 14, laser 46 may be utilized. In one embodiment, laser 46 may comprise a carbon dioxide laser that produces a laser beam 48 having a wavelength in the mid-infrared range, and more particularly, a wavelength in a range of 9.0 to 11.0 microns. In the embodiment wherein fluid port 26 defines a circular tapered aperture 27 having width 34 across a lower region 28 of the aperture, sphere 52 may define a diameter 56 slightly greater than width 34. In one embodiment width 34 of aperture 27 may be approximately 50 microns and diameter 56 of sphere 52 may be approximately 75 microns. Laser 46 may be directed only over sealing region 54, as defined in this embodiment by line of contact 60, within aperture 27 such that sphere 52 is melted and hermetically sealed to inner surface 58 of aperture 27. In this manner, the entire container 10 is not heated and damage to electronic component 20, and/or hermetic seal 24 between cover 14 and base 16, may be reduced or eliminated. Laser 46 may be directed only over sealing region 54 by movement of the laser, movement of the container, movement of both the laser and the container, by programming the laser to movably direct its beam throughout sealing region 54, or by any other suitable method. Other variations and modifications of the concepts described herein may be utilized and fall within the scope of the claims below.

We claim:

1. An electronic component packaging system, comprising:
    a base adapted for supporting an electronic component; and
    a lid sealed to said base, said lid including a fillport; and
    a seal material positioned within and hermetically sealing said fillport, said seal material manufactured of a non-conductive material that deforms when irradiated with light,
    wherein the seal material comprises a plurality of spheres before deformation, and wherein following deformation the plurality of spheres are melted one to another and to the fillport to hermetically seal the fillport.

2. The system of claim 1, wherein said seal material having a coefficient of thermal expansion substantially the same as a coefficient of thermal expansion of said lid.

3. The system of claim 1 wherein said fillport defines a tapered recess that receives the plurality of spheres, and wherein a diameter of at least one sphere of the plurality is greater than a smallest width of said tapered recess.

4. The system of claim 1 wherein said light irradiation comprises light directed to trace around a line of contact between at least one of the spheres and the fillport to melt said sphere along said line of contact to said fillport.

5. The system of claim 2 wherein said lid and said seal material are both chosen from one of ceramic and glass.

6. The system of claim 1 wherein said packaging system is filled with a fluid through said fillport prior to sealing of said fillport.

7. The system of claim 1 wherein said light irradiation comprises one of light from a carbon dioxide laser having a wavelength in a range of 9.0 to 11.0 microns, a light from a Nd:YAG laser having a wavelength of substantially 1064 nm, and a semiconductor laser having a wavelength range of 800 to 950 nm.

8. The system of claim 1 wherein said light irradiation produces heat localized at said fillport.

9. The system of claim 1 wherein at least one sphere of the plurality includes a coating of material adapted to facilitate melting thereof when subjected to said light irradiation.

10. The system of claim 1 wherein at least one sphere of the plurality includes an additive adapted to facilitate melting of said sphere when subjected to said light irradiation.

11. A method of sealing a fillport in a microelectronic package, comprising:
    placing a non-conductive sealing material at a fillport of a microelectronic package cover; and
    irradiating said seal material with light to deform said material so as to form a hermetic seal of said fillport,
    wherein said sealing material comprises a plurality of spheres positioned within said fillport, and wherein said irradiating comprises directing a laser over said plurality of spheres to weld said spheres to one another and to said fillport.

12. The method of claim 11 wherein said sealing material further comprises a plate positioned over said fillport and wherein said irradiating further comprises directing a laser around an edge of said plate to weld said edge to said cover.

13. The method of claim 11 wherein said sealing material and said cover are each chosen from one of glass, ceramic and metal.

14. The method of claim 11 wherein said irradiation comprises one of light from a carbon dioxide laser having a wavelength in a range of 9.0 to 11.0 microns, a light from a Nd:YAG laser having a wavelength of substantially 1064 nm, and a semiconductor laser having a wavelength range of 800 to 950 nm.

15. The method of claim 11 wherein said seal material has a coefficient of thermal expansion substantially the same as a coefficient of thermal expansion of said cover.

16. The method of claim 11 further comprising, prior to irradiating, flowing a fluid through said fillport into an interior of said package.

17. A method of sealing a semiconductor component package, comprising:
    placing a plurality of non-conductive spheres in a recess of a cover of a semiconductor component package; and
    welding the spheres to one another and to the recess to define a hermetic seal between the spheres and the recess.

18. The method of claim 17 wherein said welding comprises focused light irradiation.

19. The method of claim 18 wherein said irradiation comprises one of focused light from a carbon dioxide laser having a wavelength in a range of 9.0 to 11.0 microns, a focused light from a Nd:YAG laser having a wavelength of substantially 1064 nm, and a semiconductor laser having a wavelength range of 800 to 950 nm.

20. The method of claim 17 wherein said recess defines a tapered recess and wherein said at least one sphere of the plurality defines a diameter greater than a smallest width of said tapered recess.

21. The method of claim 17 wherein the plurality of spheres has a coefficient of thermal expansion substantially the same as a coefficient of thermal expansion of said cover.

22. An electronic component packaging system, comprising:
    base means for supporting an electronic component; and
    lid means for sealing said base, said lid means including means for filling and means for hermetically sealing positioned within said means for filling, said means for hermetically sealing manufactured of a non-conductive material that deforms when irradiated with light,
    wherein the non-conductive material comprises a plurality of spheres that when irradiated the spheres deform and melt to one another and to the means for filling to form a hermetic seal.

23. The system of claim 22 wherein said light irradiation is chosen from one of focused light from a carbon dioxide laser having a wavelength in a range of 9.0 to 11.0 microns, a focused light from a Nd:YAG laser having a wavelength of substantially 1064 nm, and a semiconductor laser having a wavelength range of 800 to 950 nm.

24. The system of claim 22 wherein said means for filling comprises a tapered recess that narrows in a lower section of said recess, and wherein said means for hermetically sealing comprises at least one sphere of the plurality having a diameter greater than a width of said lower section of said recess.

* * * * *